(12) United States Patent
Isa

(10) Patent No.: US 9,356,082 B2
(45) Date of Patent: *May 31, 2016

(54) DISPLAY DEVICE

(71) Applicant: Semiconductor Energy Laboratory Co., Ltd., Kanagawa-ken (JP)

(72) Inventor: Toshiyuki Isa, Atsugi Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/657,419

(22) Filed: Mar. 13, 2015

(65) Prior Publication Data

US 2015/0187852 A1 Jul. 2, 2015

Related U.S. Application Data

(63) Continuation of application No. 13/955,568, filed on Jul. 31, 2013, now Pat. No. 8,981,638.

(30) Foreign Application Priority Data

Aug. 1, 2012 (JP) ................................. 2012-171410

(51) Int. Cl.
*H05B 33/00* (2006.01)
*H01J 1/62* (2006.01)
(Continued)

(52) U.S. Cl.
CPC .......... *H01L 27/3248* (2013.01); *H01L 27/322* (2013.01); *H01L 27/3211* (2013.01); *H01L 27/3246* (2013.01); *H01L 29/7869* (2013.01); *H01L 51/5215* (2013.01); *H01L 51/5234* (2013.01); *H01L 51/5253* (2013.01); *H01L 51/5265* (2013.01); *H01L 51/5284* (2013.01); *H05B 33/02* (2013.01); *H01L 27/3206* (2013.01); *H01L 27/3209* (2013.01); *H01L 51/5218* (2013.01); *H01L 2251/5315* (2013.01); *H01L 2251/558* (2013.01)

(58) Field of Classification Search
CPC ............ H01L 27/3248; H01L 51/5234; H01L 51/5215; H01L 51/5253; H01L 29/7869; H01L 27/322
USPC .......................................... 313/498, 504, 512
See application file for complete search history.

(56) References Cited

U.S. PATENT DOCUMENTS 5,119,156 A 6/1992 Kawahara et al.
6,373,453 B1 4/2002 Yudasaka
(Continued)

FOREIGN PATENT DOCUMENTS

JP 11-339958 A 12/1999
JP 2003-059671 A 2/2003
(Continued)

*Primary Examiner* — Joseph L Williams
(74) *Attorney, Agent, or Firm* — Husch Blackwell LLP

(57) ABSTRACT

To improve image quality of a full-color organic EL display panel. A partition has a stacked structure formed using different materials. A lower partition has a curved shape, and an upper partition has a flat top surface. An angle formed between a plane surface connecting a lower end of a side surface with an upper end of the side surface of the upper partition and the top surface of the upper partition is less than or equal to 90°. The height of the partition is controlled to be greater than or equal to 0.5 μm and less than or equal to 1.3 μm. With such a structure, a large color organic EL display panel achieves high-definition display.

30 Claims, 10 Drawing Sheets

(51) Int. Cl.
  *H01L 27/32*     (2006.01)
  *H05B 33/02*     (2006.01)
  *H01L 29/786*    (2006.01)
  *H01L 51/52*     (2006.01)

(56) References Cited

U.S. PATENT DOCUMENTS

| | | | |
|---|---|---|---|
| 6,392,722 B1 | 5/2002 | Sekime et al. | |
| 6,420,834 B2 | 7/2002 | Yamazaki et al. | |
| 6,555,968 B2 | 4/2003 | Yamazaki et al. | |
| 6,559,594 B2 | 5/2003 | Fukunaga et al. | |
| 6,597,121 B2 | 7/2003 | Imura | |
| 6,614,174 B1 | 9/2003 | Urabe et al. | |
| 6,618,029 B1 | 9/2003 | Ozawa | |
| 6,720,198 B2 | 4/2004 | Yamagata et al. | |
| 6,750,618 B2 | 6/2004 | Yamazaki et al. | |
| 6,768,257 B1 | 7/2004 | Yamada et al. | |
| 6,798,132 B2 | 9/2004 | Satake | |
| 6,815,723 B2 | 11/2004 | Yamazaki et al. | |
| 6,828,726 B2 * | 12/2004 | Sakurai et al. | 313/506 |
| 6,828,727 B2 * | 12/2004 | Yamazaki | 313/509 |
| 6,969,291 B2 | 11/2005 | Urabe et al. | |
| 6,991,506 B2 | 1/2006 | Yamada et al. | |
| 6,992,439 B2 | 1/2006 | Yamazaki et al. | |
| 7,015,503 B2 | 3/2006 | Seki et al. | |
| 7,057,209 B2 | 6/2006 | Yamazaki et al. | |
| 7,098,602 B2 | 8/2006 | Yamazaki et al. | |
| 7,173,281 B2 | 2/2007 | Hirakata et al. | |
| 7,214,959 B2 | 5/2007 | Seki et al. | |
| 7,221,338 B2 | 5/2007 | Yamazaki et al. | |
| 7,265,391 B2 | 9/2007 | Yamazaki et al. | |
| 7,273,801 B2 | 9/2007 | Seki et al. | |
| 7,384,860 B2 | 6/2008 | Nakamura et al. | |
| 7,402,948 B2 | 7/2008 | Yamazaki et al. | |
| 7,420,210 B2 | 9/2008 | Yamazaki et al. | |
| 7,423,293 B2 | 9/2008 | Yamagata et al. | |
| 7,442,955 B2 | 10/2008 | Seki et al. | |
| 7,585,761 B2 | 9/2009 | Yamazaki et al. | |
| 7,623,098 B2 | 11/2009 | Yamazaki et al. | |
| 7,623,099 B2 | 11/2009 | Yamazaki et al. | |
| 7,623,100 B2 | 11/2009 | Yamazaki et al. | |
| 7,662,011 B2 | 2/2010 | Yamazaki et al. | |
| 7,683,535 B2 | 3/2010 | Fukunaga et al. | |
| 7,692,186 B2 | 4/2010 | Yamazaki et al. | |
| 7,697,106 B2 | 4/2010 | Sawasaki et al. | |
| 7,719,014 B2 | 5/2010 | Yamazaki et al. | |
| 7,745,993 B2 | 6/2010 | Fukunaga et al. | |
| 7,753,751 B2 | 7/2010 | Yamazaki | |
| 7,792,489 B2 | 9/2010 | Hirakata et al. | |
| 7,932,518 B2 | 4/2011 | Seki et al. | |
| 7,977,876 B2 | 7/2011 | Yamazaki et al. | |
| 7,982,206 B2 | 7/2011 | Yamazaki et al. | |
| 7,990,348 B2 | 8/2011 | Yamazaki et al. | |
| 8,089,066 B2 | 1/2012 | Yamazaki et al. | |
| 8,119,468 B2 | 2/2012 | Miyairi et al. | |
| 8,138,032 B2 | 3/2012 | Miyairi et al. | |
| 8,194,008 B2 | 6/2012 | Yamazaki et al. | |
| 8,237,355 B2 | 8/2012 | Yamazaki | |
| 8,432,097 B2 | 4/2013 | Hirakata et al. | |
| 8,441,185 B2 | 5/2013 | Kuwabara et al. | |
| 8,866,176 B2 | 10/2014 | Hirakata et al. | |
| 8,928,011 B2 | 1/2015 | Tanada et al. | |
| 8,928,018 B2 | 1/2015 | Ikeda et al. | |
| 8,981,638 B2 * | 3/2015 | Isa | 313/498 |
| 9,006,755 B2 | 4/2015 | Seo et al. | |
| 9,123,912 B2 | 9/2015 | Yamazaki et al. | |
| 9,159,774 B2 | 10/2015 | Hirakata et al. | |
| 2002/0047514 A1 | 4/2002 | Sakurai et al. | |
| 2002/0093286 A1 | 7/2002 | Ohshita et al. | |
| 2003/0146439 A1 | 8/2003 | Yamazaki et al. | |
| 2003/0189400 A1 | 10/2003 | Nishio et al. | |
| 2004/0061118 A1 | 4/2004 | Yamazaki et al. | |
| 2006/0081844 A1 | 4/2006 | Hirosue et al. | |
| 2007/0015430 A1 | 1/2007 | Nishio et al. | |
| 2007/0045621 A1 | 3/2007 | Suzuki et al. | |
| 2009/0020751 A1 | 1/2009 | Seki et al. | |
| 2010/0171138 A1 | 7/2010 | Yamazaki et al. | |
| 2011/0266548 A1 | 11/2011 | Yamazaki et al. | |
| 2012/0217516 A1 | 8/2012 | Hatano et al. | |
| 2012/0273804 A1 | 11/2012 | Hatano | |
| 2012/0305922 A1 | 12/2012 | Yamazaki | |
| 2013/0001620 A1 | 1/2013 | Sugisawa et al. | |

FOREIGN PATENT DOCUMENTS

| | | |
|---|---|---|
| JP | 2003-123969 A | 4/2003 |
| JP | 2003-243171 A | 8/2003 |
| JP | 2005-235491 A | 9/2005 |
| JP | 2007-141821 A | 6/2007 |

* cited by examiner

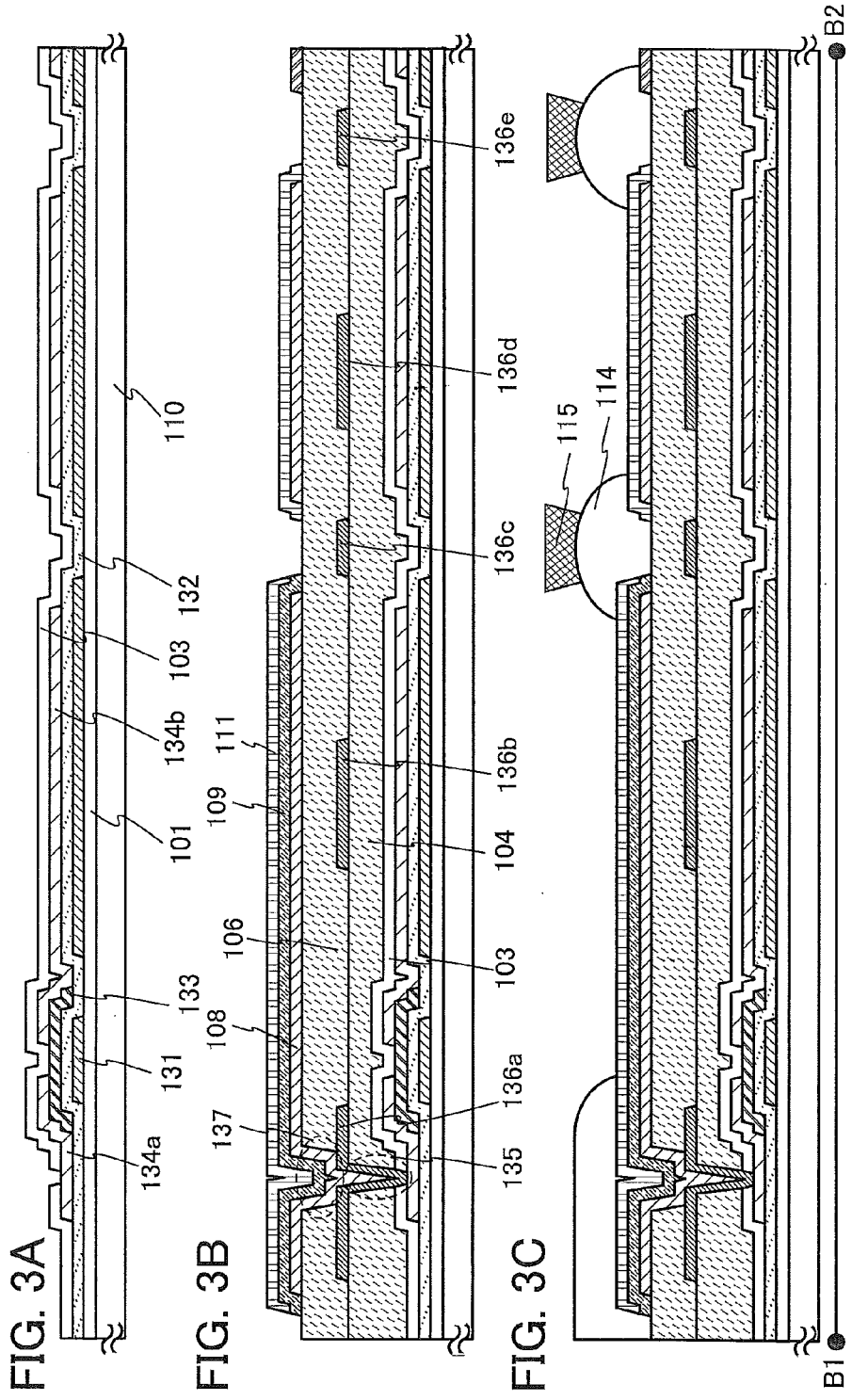

DISPLAY DEVICE

This application is a continuation of copending U.S. application Ser. No. 13/955,568, filed on Jul. 31, 2013 which is incorporated herein by reference.

BACKGROUND OF THE INVENTION

1. Field of the Invention

The present invention relates to a display device and a method for manufacturing the display device. In particular, the present invention relates to a display device utilizing organic electroluminescence (EL) (the device is referred to as organic EL display device) and a method for manufacturing the display device.

The present invention relates to an organic EL display device including a high-definition display panel and a method for manufacturing the organic EL display device. In particular, the present invention relates to an organic EL display device in which a shape of a partition separating pixels and a height of the partition are adjusted, and a method for manufacturing the organic EL display device.

2. Description of the Related Art

In recent years, color organic EL display panels using an oxide semiconductor for a TFT have been suggested. Varied development has been conducted. For example, in order to keep high color reproducibility or to achieve high-definition display by extracting light with high color purity, a display panel in which a white organic EL element, three color filters of red (R), green (G), and blue (B), and a microcavity structure utilizing multiple reflection are combined has been formed. When the color filter and the microcavity structure are combined, reflection of external light can be reduced, and light emitted from the white organic EL element can be extracted efficiently.

The microcavity structure is a technique in which the optical path length is optimized in accordance with the light wavelength of three colors of RGB (e.g., R: 700 nm, G: 550 nm, and B: 440 nm) to increase the intensity of light with a desired wavelength and extract the light. For example, optimization of the optical path length is conducted by changing the thickness of a transparent conductive layer. The thickness of a transparent conductive layer in a pixel where red light is emitted is larger than that in a pixel where green light is emitted.

Further, in a large-sized color organic EL display panel, a top emission method is suggested. A top emission method is a method in which light is extracted from a side opposite to a substrate where a TFT is formed and thus part of light emitted from the pixel is not blocked by a TFT, a wiring, and the like. Accordingly, a top emission method enables the aperture ratio to be improved as compared with a bottom emission method in which light is extracted from a substrate side where a TFT is formed. One of features of a top emission method is that a color filter can be used relatively simply.

A method in which a color filter is overlapped with a white organic EL element enables color separation of three colors of RGB relatively easily as compared with a separate coloring method in which high-definition coloring is separately performed with use of a metal mask to form light-emitting layers emitting three colors of RGB independently.

As an example of a structure of a white organic EL element, a tandem light-emitting element in which a plurality of light-emitting units and an intermediate unit are stacked between an anode and a cathode can be given. Each of the units is formed with a plurality of deposited layers. Light from the whole tandem light-emitting element can be white light by overlapping of emission colors emitted from the plurality of light-emitting units. For example, a white organic EL element can be formed with a stacked structure including a B unit formed with four deposited layers, an intermediate unit formed with four deposited layers over the B unit, and R and G units formed with eight deposited layers over the intermediate unit.

In Patent Document 1, a highly reliable display device in which shape defects of a pixel electrode are prevented to achieve high-definition display is disclosed. A partition having a thin portion and a thick portion is formed with a single layer. With the thin portion, poor coverage of a light-emitting layer at a boundary between the pixel electrode and the partition is suppressed. The thick portion of the partition supports a deposition mask to suppress twist or deflection of the deposition mask, which prevents damage such as a blemish caused by the deposition mask to be generated on a pixel electrode surface.

REFERENCE

Patent Document

[Patent Document 1] Japanese Published Patent Application No. 2007-141821

SUMMARY OF THE INVENTION

When a viewer sees an organic EL display panel having a microcavity structure in a position where the viewer's eye is in a direction perpendicular to a panel plane, the viewer can recognize high-intensity light of the desired color. On the other hands, as the position of the viewer's eye deviates from the direction perpendicular to the panel plane, it becomes difficult for the viewer to recognize light of the desired color. This is because the optical path length of light traveling in a transparent conductive layer is long in the case where the light emitted from the light-emitting layer travels in an oblique direction, as compared to the case where the light emitted from the light-emitting layer travels in a perpendicular direction. Light shifted to a shorter wavelength side is extracted from the light-emitting layer. Further, as the height of a partition separating pixels becomes larger, that is, the distance between a top surface of a reflective electrode and a color filter becomes larger, viewing angle dependency increases. The viewing angle dependency becomes a big issue, particularly in a large-sized panel.

Depending on shapes of the partitions, the leakage current from an intermediate layer included in a white organic EL element to an adjacent pixel is likely to be generated. When the adjacent pixel which is desired to be a non-light-emitting pixel emits light, light is mixed, and a color purity of the organic EL display panel is lowered.

Further, there is a case where stray light which does not travel in a perpendicular direction (light whose intensity is reduced by repetition of multiple reflection, light which does not pass through the transparent conductor layer, or the like) is propagated to an adjacent pixel through the partition. In this case, light comes in the adjacent pixel, and a display color of the organic EL display panel bleeds. The light leakage to the adjacent pixel becomes increased as the pixel size is decreased, generally.

The organic EL display panel is required to have high contrast. Depending on the shape of the partition, for example, loss of light during a period where light generated in a light-emitting layer reaches a color filter may be increased, or the minimum luminance in displaying black may be increased. Accordingly, a reduction in contrast is caused in some cases.

A variety of problems described above are caused depending on a shape and a height of a partition which is provided in a propagating path of light generated from a light-emitting layer or a conduction path of current flowing between the pixels. These problems degrade image quality of the organic EL display panel. In addition, it is difficult to keep high-definition display of the organic EL display panel in a state where an unsolved problem remains.

In the case where the partition is formed with a single layer and has a curved top surface, leakage current from the intermediate layer to an adjacent pixel is caused, and accordingly the adjacent pixel emits light in some cases.

In the case where the partition is formed with a single layer and has a reverse tapered shape in cross section, coverage with a deposition layer (light-emitting layer) is poor, and accordingly the light-emitting element emits no light in some cases.

In the case where the partition is formed using a single material to have a stacked structure in which an upper layer of the partition and a lower layer of the partition have the same shape and the size of the lower layer is larger than that of the upper layer, the NTSC ratio is reduced in some cases.

When the shape of the upper layer of the partition is differentiated from that of the lower layer of the partition, different materials with which the shapes of the upper layer and the lower layer are easily adjusted are used. Thus, it is difficult to form a partition using a single material.

In some cases, contrast is reduced in the case where a partition is formed using different materials to have a stacked structure so that a lower layer of the partition has a curved top surface and an upper layer of the partition has a reverse tapered shape in a cross section. In addition, the height of the partition is increased, and accordingly a distance between a top surface of a reflective electrode and a color filter is increased, which increases viewing angle dependency.

In order to reduce the height of the partition, the shapes of the upper layer and the lower layer of the partition are formed to have curved top surfaces and an area of a black matrix (light-blocking layer) formed on a counter substrate side is increased. With such a structure, the viewing angle dependency can be decreased. Meanwhile, generation of leakage current from the intermediate layer to the adjacent pixel and a reduction in an aperture ratio are caused.

Further, in order to prevent image degradation of the panel, it is necessary to consider light transmittance and refraction index of a partition material and a size and a width of the partition, and the like.

It is extremely difficult to determine the height, the shape, the material, and the like of the partition which enables the above problems to be efficiently solved.

Thus, an object of one embodiment of the present invention is to improve image quality of a full-color organic EL display panel.

Another embodiment of the present invention is to provide a high-definition display panel as well as achieving an increase in a panel size.

Adjusting the height and the shape of the partition makes it possible to efficiently solve the problems such as an increase in viewing angle dependency, a reduction in contrast, generation of leakage current from the intermediate layer to an adjacent pixel, and generation of light leakage to the adjacent pixel.

One embodiment of the present invention disclosed in this specification is an organic EL display device including a first electrode, a first partition overlapping with an end portion of the first electrode, a second partition over the first partition, a light-emitting layer overlapping with the first electrode, and a second electrode over the light-emitting layer. The perpendicular distance between a top surface of the first electrode and a top surface of the second partition is greater than or equal to 0.5 μm and less than or equal to 1.3 μm. An angle formed between a flat surface connecting a lower end of a side surface with an upper end of the side surface of the second partition and the top surface of the second partition is less than or equal to 90°.

One embodiment of the present invention disclosed in this specification is an organic EL display device including a first substrate, a second substrate on which a color filter layer and a black matrix are located to face the first substrate, a first electrode on a surface of the first substrate facing the second substrate, a first partition overlapping with an end portion of the first electrode, a second partition over the first partition, a light-emitting layer overlapping with the first electrode, and a second electrode over the light-emitting layer. The first substrate and the second substrate are disposed so that the first partition and the black material overlap with each other. The perpendicular distance between the a top surface of the first electrode and a top surface of the second partition is greater than or equal to 0.5 μm and less than or equal to 1.3 μm. An angle formed between a flat surface connecting a lower end of a side surface with an upper end of the side surface of the second partition and the top surface of the second partition is less than or equal to 90°.

In each of the above structure, the first partition preferably has a curved top surface. With the first partition having a curved top surface, loss of light and the minimum luminance in black display can be comparatively reduced. Thus, contrast of the organic EL display panel can be improved. In addition, coverage with the light-emitting layer can be improved, and thus, a light-emitting element can be prevented from being brought into a non-light-emitting state which is caused by short circuit between electrodes due to disconnection or the like.

In each of the above structures, the second partition is formed so that a cross section has a reverse tapered shape. Thus, leakage current from the light-emitting layer, mainly from an intermediate layer to an adjacent pixel is reduced, and unnecessary light emission of the adjacent pixel, which is a cause of color mixture, can be prevented. In other words, color purity of the organic EL display panel can be increased.

In each of the above structures, the perpendicular distance between the top surface of the first electrode and the top surface of the second partition (difference between the thickness of the first electrode and a total of the height of the first partition and the height of the second partition) is greater than or equal to 0.5 μm and less than or equal to 1.3 μm. By a reduction in the height of the partition, the distance between the top surface of the first electrode and the color filter can be decreased. Thus, viewing angle dependency can be suppressed.

In each of the above structures, a transparent conductive layer may be provided over and in contact with the first electrode. In this case, the transparent conductive layer may have a stacked structure including a plurality of transparent conductive layers. Note that in this specification, this transparent conductive layer is referred to as a microcavity layer.

When the height of the partition (or the perpendicular distance between the top surface of the first electrode and the top surface of the second partition) is low, shift of light to the shorter wavelength side (a phenomenon in which a light-emitting element emits light which is close to blue light on the shorter wavelength side, in an oblique direction), which is likely to occur in a light-emitting element including a microcavity layer, is suppressed; thus, viewing angle dependency in an organic EL display panel having a microcavity structure can be suppressed.

Note that the thickness of the microcavity layer can be adjusted in accordance with a color of light that is to be emitted. For example, in a pixel emitting red light, the thickness of a microcavity layer formed over and in contact with the first electrode can be the largest, and in a pixel emitting green light, the thickness of the microcavity layer can be smaller than that in the pixel emitting red light. Further, for example, a microcavity layer in a pixel emitting red light can have a stacked structure of two layers.

In order to decrease the perpendicular distance between the color filter and the top surface of the first electrode, the thickness of the color filter may be increased. As the color filter, a red color filter, a green color filter, a blue color filter, and the like may be used, for example. Since the transmittance varies depending on colors, the thicknesses of the color filters are preferably adjusted as appropriate. It is preferable that the thickness of the red color filter be less than or equal to 2 µm, the thickness of the green color filter be less than or equal to 2 µm, and the thickness of the blue color filter be less than or equal to 1 µm.

In this case, the perpendicular distance between the color filter (a surface thereof on the first substrate side) and the top surface of the first electrode is preferably less than or equal to 3 µm. In particular, it is preferable that the perpendicular distance between the color filter with the smallest thickness and the top surface of the first electrode be less than or equal to 3 µm. It is further preferable that the perpendicular distance between the color filter with the largest thickness and the top surface of the first electrode be equal to the perpendicular distance between the top surface of the first electrode and the top surface of the second partition.

In each of the above structures, a black matrix may be provided. By formation of the back matrix, the viewing angle dependency of the viewer can be reduced. The black matrix can be formed using a metal material with low reflectance, such as titanium or chromium, an organic insulating material impregnated with a black pigment or a black dye, or the like.

In each of the above structures, the first partition overlaps with two first electrodes adjacent to each other at end portions, and an angle formed between a top surface of one of the first electrodes and a left upper surface of the first partition and an angle formed between a top surface of the other first electrode and a right upper surface of the first partition may be different from each other.

In each of the above structures, the second partition may be disposed only between pixels of different colors.

In this case, the length in a direction of a short side of the top surface of the second partition is preferably smaller than or equal to the distance between a first electrode and another first electrode adjacent to the first electrode. Further, the length in a direction of a long side of the top surface of the second partition may be larger than or equal to the length in a direction of a long side of the first electrode.

In each of the above structures, one partition that is a second partition may be disposed between two pixels which are adjacent to each other and emit different colors from each other or between a plurality of pixels emitting first color light and a plurality of pixels emitting second color light.

In each of the above structures, the second partition may be disposed between the pixels of different colors and between pixels of the same color.

In this case, the length in the direction of the short side of the top surface of the second partition is preferably smaller than or equal to the distance between the first electrode and a first electrode adjacent to the first electrode. Further, the length in the direction of the long side of the top surface of the second partition is preferably smaller than or equal to the length in the direction of the long side of the first electrode. With such a structure, image quality of the panel can be improved without disruption of current flow between pixels of the same color.

The first partition can be formed using an organic insulating material or an inorganic insulating material. In particular, a photosensitive resin material is preferably used. The first partition can be formed using a colored organic insulating material. Further, the first partition can be formed using a brown resist material (an colored insulating material whose transmittance of light having specific wavelengths of 460 nm, 540 nm, and 620 nm is lower than or equal 50%).

The second partition can be formed using an inorganic insulating material or an organic insulating material. As the organic insulating material, for example, a negative or positive type photosensitive resin material, a non-photosensitive resin material, or the like can be used. Further, the second partition can be formed using a colored organic insulating material.

In the case where the first partition or the second partition is formed using a colored organic insulating material, the partition may serve as a black matrix.

In this specification, the term "height of partition" means the perpendicular direction between a top surface of a first electrode and a top surface of a second partition.

Note that in this specification, the term "NTSC ratio" indicates the proportion of color reproducible range in a situation where the range of color reproduced by an NTSC method is defined as 100%, on the basis of a 1976 UCS chromaticity diagram established by International Commission on Illumination (CIE). Note that the degree of color reproducibility is proportional to a value of the NTSC ratio.

Note that in this specification, the tem). "reverse tapered shape" indicates a shape having a side surface or a top surface protruding in a direction parallel to a substrate, beyond a bottom surface.

The partition has a stacked structure using different materials. In the partition having the stacked structure, a lower layer has a curved shape and an upper layer has a flat top surface and a reverse tapered shape in cross section. In addition, the height of the partition is greater than or equal to 0.5 µm and less than or equal to 1.3 µm. With such a partition, generation of light leakage to the adjacent pixel is suppressed and the viewing angle dependency is reduced, so that the contrast can be improved. In addition, leakage current from an intermediate layer to the adjacent pixel can be reduced.

Further, even in the case where the position of the viewer's eye is largely deviated from a direction perpendicular to the panel plane, high-definition display can be kept in an organic EL display panel in which the above-described partition is provided. The present invention is not readily conceived by just a mere design choice.

BRIEF DESCRIPTION OF THE DRAWINGS

FIGS. 3A to 3C are cross-sectional views illustrating a method for manufacturing an organic EL display device.

FIGS. 9A-1, 9A-2, 9A-3, 9B-1, 9B-2, and 9B-3 show display results of organic EL display devices.

DETAILED DESCRIPTION OF THE INVENTION

Figure 1:
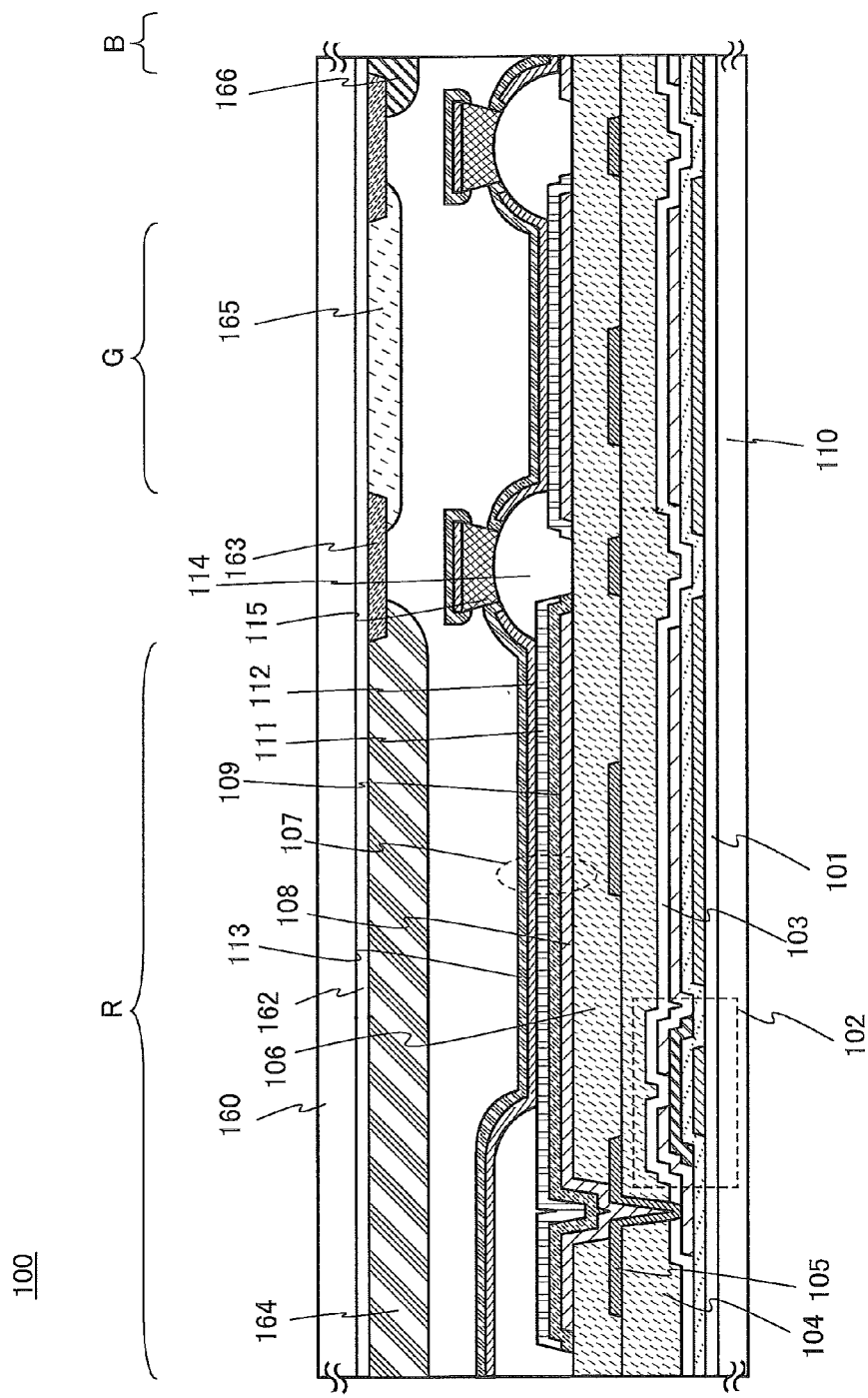
FIG. 1 is a cross-sectional view illustrating an organic EL display device.

Embodiments will be described in detail with reference to the accompanying drawings. Note that the present invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, an organic EL display device which achieves high-definition display will be described. In the organic EL display device, a shape of a partition is adjusted, and the height of the partition is controlled to be greater than or equal to 0.5 μm and less than or equal to 1.3 μm.

FIG. 1 is a cross-sectional view illustrating a specific structure of an organic EL display device 100. In the structure illustrated in FIG. 1, a wiring layer is formed between a light-emitting element and a transistor. Thus, even when the number of transistors included in each pixel is increased in accordance with high-definition display, the pixel can be miniaturized.

As illustrated in FIG. 1, the organic EL display device 100 includes a first substrate 110, a base layer 101 over the first substrate 110, a transistor 102 and an insulating layer 103 over the base layer 101, a first interlayer film 104 over the insulating layer 103, a wiring 105 electrically connected to the transistor 102, a second interlayer film 106 over the wiring 105 and the first interlayer film 104, a light-emitting element 107 electrically connected to the wiring 105, and a first partition 114 and a second partition 115 which isolate the light-emitting element 107. In addition, a second substrate 160 is included to be opposite to the first substrate 110. The second substrate 160 is provided with a base layer 162, a black matrix 163, a red color filter 164, a green color filter 165, and a blue color filter 166. The light-emitting element 107 includes a reflective electrode 108, a first microcavity layer 109, a second microcavity layer 111, a light-emitting layer 112, and a cathode 113. The light-emitting layer 112 includes at least a light-emitting organic compound.

The first partition 114 is preferably formed to have a curved top surface. The second partition 115 is preferably formed to have a flat top surface and a reverse tapered shape in cross section.

The perpendicular distance between a top surface of the reflective electrode 108 and the top surface of the second partition 115 (the distance obtained by subtracting the thickness of the reflective electrode 108 from the total of the height of the first partition and the height of the second partition) is preferably greater than or equal to 0.5 μm and less than or equal to 1.3 μm.

By a reduction in the height of the partition, the distance between the top surface of the reflective electrode 108 and the red color filter 164, the distance between the top surface of the reflective electrode 108 and the green color filter 165, and the distance between the top surface of the reflective electrode 108 and the blue color filter 166 can be decreased.

The first partition 114 can be formed using an organic insulating material or an inorganic insulating material. In particular, a photosensitive resin material is preferably used. The first partition can be formed using a colored organic insulating material.

The second partition 115 can be formed using an inorganic insulating material or an organic insulating material. As the organic insulating material, for example, a negative or positive type photosensitive resin material, a non-photosensitive resin material, or the like can be used. Further, the second partition can be formed using a colored organic insulating material. Furthermore, in order to increase a light transmitting property of the organic EL display device 100, a light-transmitting material may be used.

The first microcavity layer 109 and the second microcavity layer 111 are each formed over and in contact with the reflective electrode 108. The first microcavity layer 109 and the second microcavity layer 111 are preferably formed using a light-transmitting conductive material. The first microcavity layer 109 may have a single-layer structure or a stacked structure including a plurality of transparent conductive layers. Further, the second microcavity layer 111 may have a single-layer structure or a stacked structure including a plurality of transparent conductive layers.

By forming the first microcavity layer 109 and the second microcavity layer 111 over and in contact with the reflective electrode 108, the optical path length from the reflective electrode 108 to the cathode 113 in each of the pixel emitting red light, the pixel emitting green light, and a pixel emitting blue light, can be optimized in accordance with light wavelengths of three colors of RGB. In FIG. 1, the first microcavity layer 109 and the second microcavity layer 111 are formed in the pixel emitting red light, and the second microcavity layer 111 is formed in the pixel emitting green light. On the other hand, in the pixel emitting blue light, neither the first microcavity layer 109 nor the second microcavity layer 111 is formed. Accordingly, in the pixel emitting red light, the distance between the electrodes can be made longer, and in the pixel emitting blue light, the distance between the electrodes can be made shorter. Thus, in accordance with the light wavelengths of three colors of RGB, high-intensity light can be extracted from each light-emitting layer 112.

The thickness of the microcavity layer can be adjusted in accordance with a color of light that is to be emitted. For example, the thickness of the first microcavity layer 109 may be larger than that of the second microcavity layer 111.

Further, the following two angles may be different from each other: an angle formed between the top surface of the first partition 114 and a top surface of the second microcavity layer 111 and an angle formed between the top surface of the first partition 114 and the top surface of the reflective electrode 108.

The thicknesses of the red color filter 164, the green color filter 165, and the blue color filter 166 may be increased to decrease the perpendicular distance between the surfaces of the respective color filters and the top surface of the reflective electrode 108.

Note that in the case where the thickness of the color filter is simply increased in order to decrease the distance between the top surface of the reflective electrode 108 and the color filter, a distance between the reflective electrode and the color filter is increased in some cases. Thus, the thickness is preferably adjusted as appropriate.

Furthermore, the light transmittance of the color filter depends on a color; thus, the thickness is preferably adjusted in appropriate consideration of the transmittance or the like.

It is preferable that the thickness of the red color filter 164 be less than or equal to 2 µm, the thickness of the green color filter 165 be less than or equal to 2 µm, and the thickness of the blue color filter 166 be less than or equal to 1 µm.

Further, it is preferable that the perpendicular direction between the color filter with the smallest thickness (in this specification, the green color filter 165) and the top surface of the reflective electrode 108 be less than or equal to 3 µm. It is further preferable that the perpendicular direction between the color filter with the largest thickness (in this specification, the red color filter 164) and the top surface of the reflective electrode 108 be equal to the height of the partition.

Further, the black matrix 163 may be formed in portions where any of the red color filter 164, the green color filter 165, and the blue color filter 166 is adjacent to the other color filters. By formation of the black matrix 163, the influence of viewing angle dependency can be alleviated.

In the case where the black matrix 163 is not formed, a viewer who is at a portion directly in front of a pixel emitting green light recognizes light which is emitted from a pixel emitting red light and shifted to the shorter wavelength side through the green color filter 165 (that is, recognizes green light) and, in some cases, recognizes yellow light which is generated by mixing a red color and a green color from an adjacent portion of the red color filter 164 and the green color filter 165. Further, a viewer who is at a portion directly in front of a pixel emitting blue light recognizes light which is emitted from a pixel emitting red light and shifted to the shorter wavelength side through the blue color filter 166 (that is, recognizes blue light) and, in some cases, recognizes purple light which is generated by mixing a red color and a green color from an adjacent portion of the red color filter 164 and the blue color filter 166. When the first partition 114 and the second partition 115 are formed using a colored photosensitive resin or the like, they can serve as the black matrix 163.

In the case where the black matrix 163 is formed to have a very large area, the aperture ratio of the organic EL display device 100 is decreased. Thus, in formation of the black matrix 163 on the second substrate 160, the width of the black matrix 163 is preferably adjusted as appropriate in consideration of a balance of the viewing angle dependency, the aperture ratio, and the like.

The black matrix 163 can be formed using a metal material with low reflectance, such as titanium or chromium, an organic insulating material impregnated with a black pigment or a black dye, or the like.

Figure 2A:
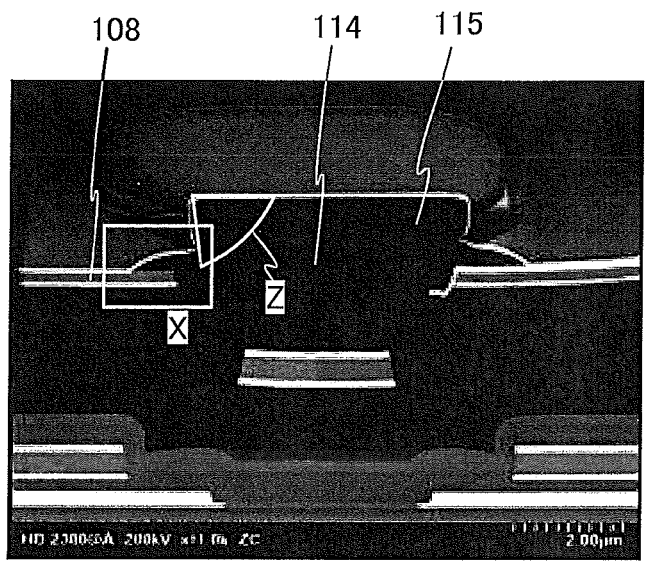
FIGS. 2A to 2C are cross-sectional STEM images and a cross-sectional view of a partition.
Figure 2B:
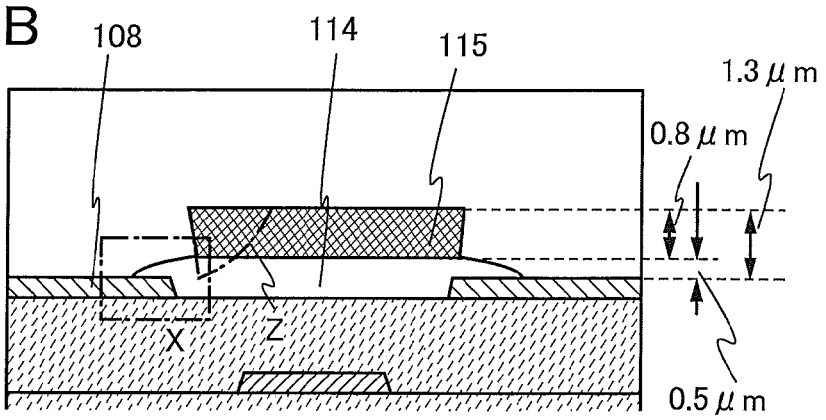
Figure 2C:
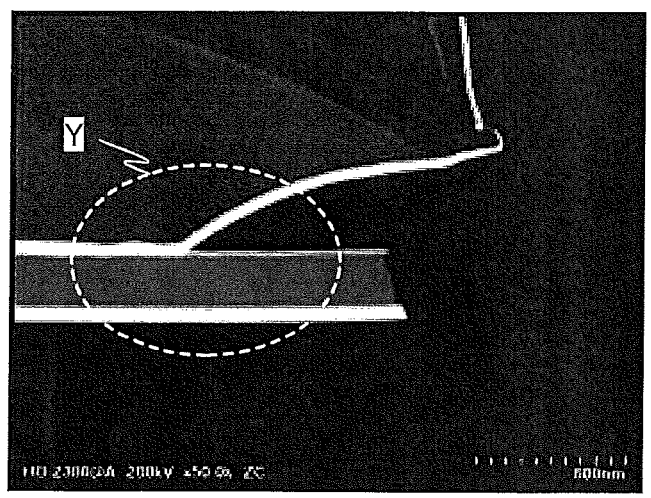

A partition which was actually formed is described with reference to FIGS. 2A to 2C. FIG. 2A is a cross-sectional STEM image of the partition, FIG. 2B is a schematic diagram of the STEM image of FIG. 2A, and FIG. 2C is an enlarged STEM image of a portion X shown in FIG. 2A. Note that a cross-sectional view taken along solid line A1-A2 in FIG. 4 corresponds to the cross-sectional STEM image of FIG. 2A.

The organic EL display device 100 includes the first partition 114 and the second partition 115 shown in FIG. 2A.

The perpendicular direction between the top surface of the reflective electrode 108 and the top surface of the second partition 115, that is, the height of the partition, is 1.3 µm.

When the height of the partition is greater than 1.3 µm, light which is generated from the light-emitting layer and shifted to the shorter wavelength side is likely to pass through a color filter in an adjacent pixel. In the case where a position of the viewer's eye deviates from the direction perpendicular to a panel plane, the viewer recognizes a color which is a mixed color of a given color filter and a color of a color filter of an adjacent pixel. As the position of the viewer's eye largely deviates from the perpendicular direction, the viewing angle dependency is increased.

When the height of the partition is less than or equal to 1.3 µm, light which is generated from the light-emitting layer and shifted to the shorter wavelength side is less likely to reach a color filter in an adjacent pixel and is easily absorbed in a color filter of a desired color. Even when a position of the viewer's eye deviates from the direction perpendicular to the panel plane, the viewer easily recognizes the desired color. This effect appears noticeably in the organic EL display device 100 including the microcavity structure.

Accordingly, it is important that the height of the partition be less than or equal to 1.3 µm. A value which is less than or equal to 1.3 µm enables the problems such as light leakage to an adjacent pixel, an increase in viewing angle dependency, and a reduction in contrast to be solved efficiently and can also lead to a synergistic effect.

Further, as illustrated in FIG. 2A, the first partition 114 is formed to have a curved top surface. With such a shape, loss of light can be reduced and the minimum luminance in black display can be reduced, which leads to an improvement in contrast of the organic EL display device 100.

When the first partition 114 has the above-described shape, the light-emitting layer 112 can cover an end portion of the first partition 114 more adequately, as shown in a portion Y in FIG. 2C. Accordingly, the light-emitting element 107 can be prevented from being brought into a non-light-emitting state due to disconnection of the light-emitting layer 112 or the like. Note that FIG. 2C is an enlarged portion of part in FIG. 2A.

Further, as shown in a portion Z in FIG. 2B, the second partition 115 is formed to have a flat top surface and a reverse tapered shape in cross section. With the above shape, the leakage current from the light-emitting layer 112, mainly an intermediate layer in the light-emitting layer 112, to an adjacent pixel is reduced, and unnecessary light emission of the adjacent pixel, which is a cause of color mixture, can be prevented. The above effect leads to an improvement in color purity of the organic EL display device 100.

Thus, even when the pixels are miniaturized and the panel has a larger size, in the organic EL display device 100 including the first partition 114 and the second partition 115, high-definition display and an improvement in image quality can be achieved.

Figure 7A:
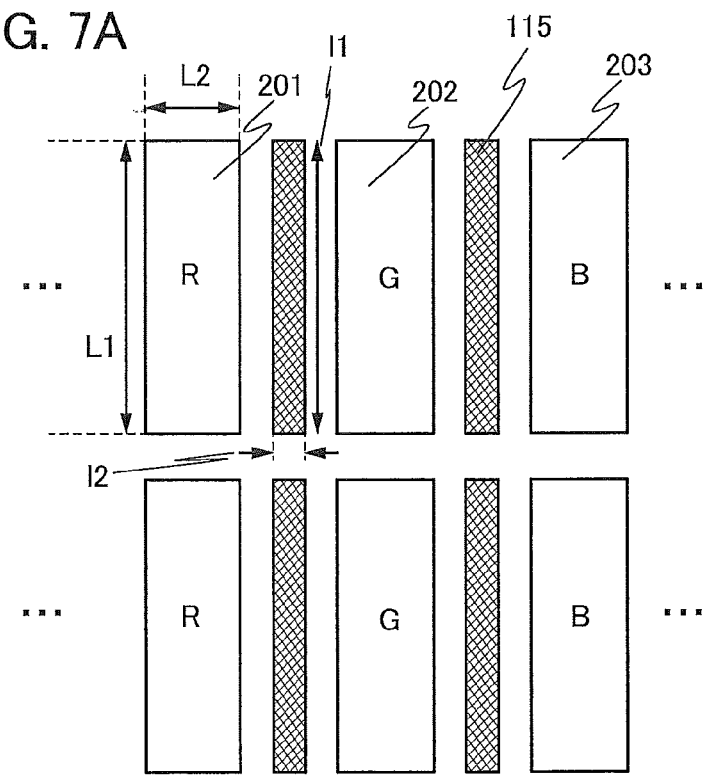
FIGS. 7A and 7B are schematic views each illustrating the arrangement of partitions.
Figure 7B:
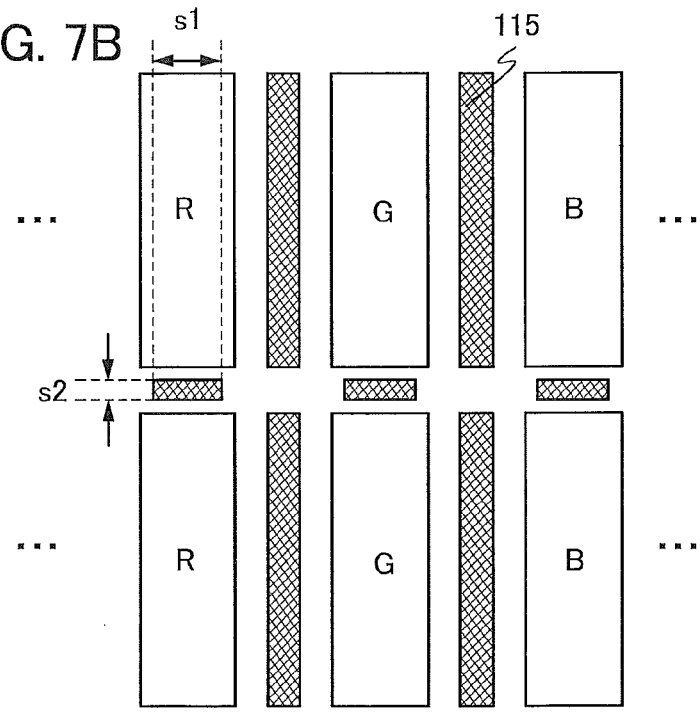

FIGS. 7A and 7B each illustrate arrangement of partitions.

As illustrated in FIG. 7A, the second partitions 115 which separate a pixel 201 emitting red light, a pixel 202 emitting green light, and a pixel 203 emitting blue light may be disposed only between pixels which emit different colors from each other. For example, the second partitions 115 may be disposed between the pixel 201 emitting red light and the pixel 202 emitting green light, between the pixel 202 emitting green light and the pixel 203 emitting blue light, and between the pixel 203 emitting blue light and the pixel 201 emitting red light.

In this case, a length l2 of the top surface of second partition 115, which corresponds to a length between the pixel 201 emitting red light and the pixel 202 emitting green light, is preferably smaller than or equal to a distance between the reflective electrode 108 of the pixel 201 emitting red light and the reflective electrode 108 of the pixel 202 emitting green light. A length l2 which corresponds to a length between the pixel 202 emitting green light and the pixel 203 emitting blue light is preferably smaller than or equal to a distance between the reflective electrode 108 of the pixel 202 emitting green light and the reflective electrode 108 of the pixel 203 emitting blue light. A length l2 which corresponds to a length between the pixel 203 emitting blue light and the pixel 201 emitting red light is preferably smaller than or equal to a distance between the reflective electrode 108 of the pixel 203 emitting blue light and the reflective electrode 108 of the pixel 201 emitting red light.

A length l1 of the top surface of the second partition 115 may be larger than or equal to a length L1 of the pixel (for example, the length in a direction of a long side of the reflective electrode 108).

As illustrated in FIG. 7B, the second partitions 115 which separate the pixel 201 emitting red light, the pixel 202 emitting green light, and the pixel 203 emitting blue light may be disposed between pixels of different colors and between pixels of the same colors. For example, the second partitions 115 may be disposed between the pixel 201 emitting red light and the pixel 202 emitting green light, between the pixel 202 emitting green light and the pixel 203 emitting blue light, between the pixel 203 emitting blue light and another pixel 201 emitting red light, between the pixel 201 emitting red light and the pixel 201 emitting red light, between the pixel 202 emitting green light and another pixel 202 emitting green light, between the pixel 203 emitting blue light and another pixel 203 emitting blue light, and the like.

In this case, the length l2 of the top surface of the second partition 115 disposed between the pixels of different colors, which corresponds to a length between the pixel 201 emitting red light and the pixel 202 emitting green light, is preferably smaller than or equal to a distance between the reflective electrode 108 of the pixel 201 emitting red light and the reflective electrode 108 of the pixel 202 emitting green light. The length l2 which corresponds to a length between the pixel 202 emitting green light and the pixel 203 emitting blue light is preferably smaller than or equal to a distance between the reflective electrode 108 of the pixel 202 emitting green light and the reflective electrode 108 of the pixel 203 emitting blue light. The length l2 which corresponds to a length between the pixel 203 emitting blue light and the pixel 201 emitting red light is preferably smaller than or equal to a distance between the reflective electrode 108 of the pixel 203 emitting blue light and the reflective electrode 108 of the pixel 201 emitting red light.

A length s2 of the top surface of the second partition 115 disposed between pixels of the same colors, which corresponds to a length between two pixels 201 emitting red light, is preferably smaller than or equal to a distance between the reflective electrode 108 of one pixel 201 emitting red light and the reflective electrode 108 of the other pixel 201 emitting red light. A length s2 which corresponds to a length between two pixels 202 emitting green light is preferably smaller than or equal to a distance between the reflective electrode 108 of the pixel 202 emitting green light and the reflective electrode 108 of the pixel 202 emitting green light. A length s2 which corresponds to a length between two pixels 203 emitting blue light is preferably smaller than or equal to a distance between the reflective electrode 108 of one pixel 203 emitting blue light and the reflective electrode 108 of the other pixel 203 emitting blue light.

Further, a length s1 of the top surface of the second partition 115 is preferably smaller than or equal to a length L2 of the pixel (for example, the length of the short side of the reflective electrode 108).

Next, an improvement in image quality of the display panel when the height of the partition is less than or equal to 1.3 μm is described with reference to FIGS. 9A-1, 9A-2, and 9A-3 and FIGS. 9B-1, 9B-2, and 9B-3.

FIGS. 9A-1, 9A-2, and 9A-3 show display results of a display panel of the organic EL display device 100 illustrated in FIG. 1. In the case of FIGS. 9A-1, 9A-2, and 9A-3, the height of a partition is 1.3 μm. FIGS. 9B-1, 9B-2, and 9B-3 show display results of a display panel of an organic EL display device different from the organic EL display device 100. In the case of FIGS. 9B-1, 9B-2, and 9B-3, the height of a partition is 2.4 μm.

Figures 3, 9A:
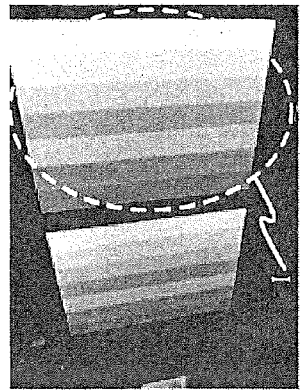
Figures 3, 9B:
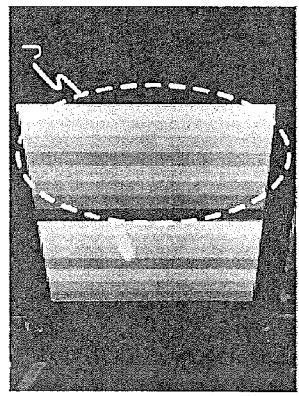
Figures 2, 9A:
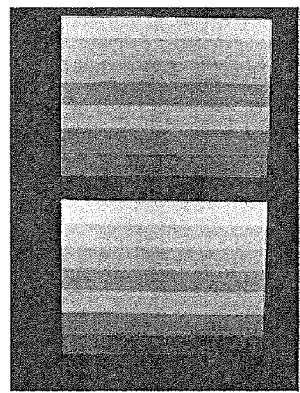
Figures 2, 9B:
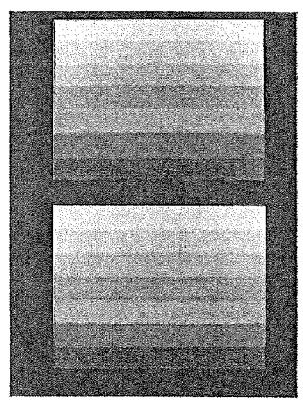
Figures 1, 9A:
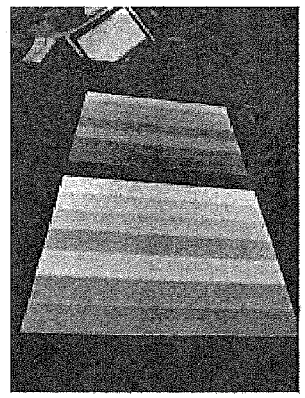
Figures 1, 9B:
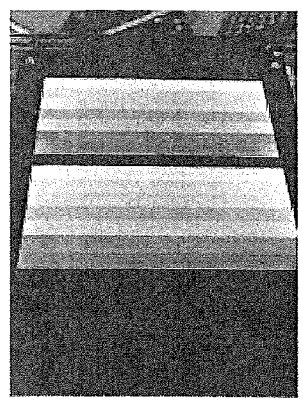
Figure 10A:
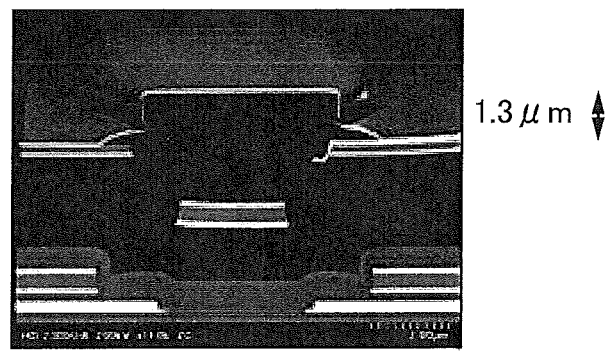
FIGS. 10A and 10B are cross-sectional STEM images of partitions.
Figure 10B:
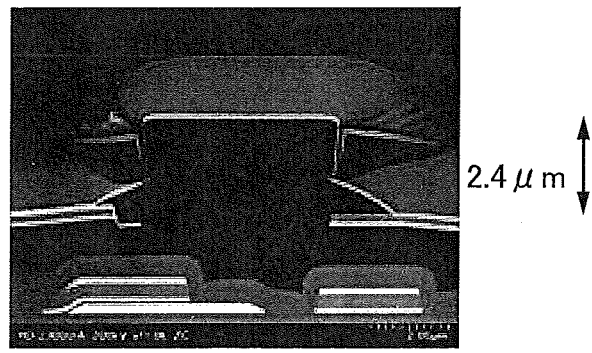

The partition used in FIGS. 9A-1, 9A-2, and 9A-3 is shown in FIG. 10A. The partition used in FIGS. 9B-1, 9B-2, and 9B-3 is shown in FIG. 10B. As shown in FIG. 10A, a lower partition is formed to have a curved top surface, and an upper partition is formed to have a flat surface and a reverse tapered shape in cross section. Similarly, as shown in FIG. 10B, a lower partition is formed to have a curved top surface, and an upper partition is formed to have a flat top surface and a reverse tapered shape in cross section.

In other words, the partition used in FIGS. 9A-1, 9A-2, and 9A-3 and the partition used in FIGS. 9B-1, 9B-2, and 9B-3 have the same shape and different heights. The difference in the heights of the partition is 1.1 μm.

FIGS. 9A-1 and FIG. 9B-1 show the display results when the position of eye is deviated to the left side by 60° from the direction perpendicular to the display panel. FIGS. 9A-2 and FIG. 9B-2 show the display results when the position of eye is aligned in the direction perpendicular to the display panel. FIGS. 9A-3 and FIG. 9B-3 show the display results when the position of eye is deviated to the right side by 60° from the direction perpendicular to the display panel.

By comparison of display results between FIGS. 9A-2 and FIG. 9B-2, it is found that there is almost no difference in the display results in the case where the position of the eye is aligned in the direction perpendicular to the display panel.

As shown in each of FIGS. 9A-2 and FIG. 9B-2, seven vertical lines are arranged from the central portion of the panel toward to the right edge of the panel. In order from the left side, the displayed colors are blue, red, pink, green, light blue, yellow, and white. The displayed colors are arranged from left to right so as to be gradually pale. Similarly, seven vertical lines are arranged from the left edge to the central portion of the panel. In order from the left side, the displayed colors are blue, red, pink, green, light blue, yellow, and white. The displayed colors are arranged from left to right so as to be gradually pale.

However, it is found by comparison between FIGS. 9A-3 and FIG. 9B-3 that there is a clear difference in the display results in the case where the position of eye is deviated from the direction perpendicular to the display panel. It is found that the display result shown in FIG. 9A-3 is superior to that shown in FIG. 9B-3.

In a portion I in FIG. 9A-3, the displayed colors arranged from the central portion to the right edge of the panel are blue, red, pink, green, light blue, yellow, and white. Seven vertical lines with the same colors and the same arrangement as those in FIG. 9A-2 are clearly displayed. In addition, there is almost no color unevenness.

On the other hand, in a portion J in FIG. 9B-3, colors adjacent to each other are mixed, and the displayed colors arranged from the central portion to the right edge of the panel are purple, ocher, pink, light green, light blue, gray, and white. Seven vertical lines with different colors and different arrangement from those in FIG. 9B-2 are displayed. In addition, there is color unevenness. The color purity is reduced, and color mixture occurs; thus, image quality of the display panel is degraded.

Accordingly, by optimizing the shape of the upper partition and the shape of lower partition, the difference in the height of the partition, which is 1.1 μm, is generated. This difference in the height causes a great difference in image quality of the display panel.

Therefore, according to the display results in FIGS. 9A-1, 9A-2, and 9A-3 and FIGS. 9B-1, 9B-2, and 9B-3, with the partition whose height is less than or equal to 1.3 μm, high-definition display of an organic EL color display panel can be achieved.

Next, a method for manufacturing the organic EL display device 100 illustrated in FIG. 1 is described in detail with reference to FIGS. 3A to 3C, FIG. 4, and FIGS. 5A to 5C.

First, a method for forming the transistor 102 and the light-emitting element 107 over the first substrate 110 is described with reference to FIGS. 3A to 3C and FIG. 4.

As illustrated in FIG. 3A, the base layer 101 is formed over the first substrate 110 by a plasma CVD method, a sputtering method, or the like.

Although there is no particular limitation on a substrate which can be used as the substrate 110, it is necessary that the substrate have at least heat resistance high enough to withstand heat treatment that is performed later. For example, a glass substrate of barium borosilicate glass, aluminoborosilicate glass, or the like, a ceramic substrate, a quartz substrate, a sapphire substrate, or the like can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 110, or the substrate provided with a semiconductor element can be used as the substrate 110. Alternatively, a plastic substrate having heat resistance high enough to withstand heat treatment that is performed later may be used.

The base layer 101 can be formed using silicon oxide, silicon oxynitride, aluminum oxide, aluminum oxynitride, hafnium oxide, gallium oxide, gallium zinc oxide, zinc oxide, or a mixed material thereof. The base layer 101 may be either a single layer or a stack of layers.

In this embodiment, a 100-nm-thick silicon nitride film and a 150-nm-thick silicon oxynitride film are stacked.

In the case where a glass substrate is used as the first substrate 110, the base layer 101 has a function of preventing contamination from the glass substrate.

Next, a conductive film is formed over the base layer 101 by a sputtering method, an evaporation method, or the like and is etched to form a conductive layer 131.

The conductive layer 131 can be formed using a metal material such as molybdenum, titanium, tantalum, tungsten, aluminum, copper, chromium, neodymium, or scandium or an alloy material which contains any of these materials as its main component. Alternatively, the conductive layer 131 can be formed using a metal nitride film including any of the metal materials or the alloy materials (a titanium nitride film, a tantalum nitride film, a molybdenum nitride film, a tungsten nitride film, or the like). The conductive layer 131 may be either a single layer or a stacked layer.

The conductive layer 131 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive layer 131 has a stacked structure of the above conductive material and the above metal material.

In this embodiment, a 50-nm-thick tantalum nitride film, a 200-nm-thick copper film, and a 30-nm-thick tungsten film are stacked.

Next, a gate insulating layer 132 is formed by a plasma CVD method, a sputtering method, or the like over the conductive layer 131.

The gate insulating layer 132 can be formed using silicon oxide, silicon nitride, silicon oxynitride, silicon nitride oxide, aluminum oxide, aluminum oxynitride, hafnium oxide, gallium oxide, gallium oxide zinc, or zinc oxide, or a mixed material of any of these materials. Further, the gate insulating layer 132 may be either a single layer or a stacked layer.

In this embodiment, a 50-nm-thick silicon nitride film and a 270-nm-thick silicon oxynitride film are stacked.

Next, a semiconductor layer is formed over the gate insulating layer 132 by a sputtering method or the like and then subjected to photolithography to form an island-shaped semiconductor layer 133.

The following materials can be used for the semiconductor layer 133 as appropriate: single crystal silicon; polycrystalline silicon; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, or an In—Sn—Hf—Zn-based oxide; or the like.

In this embodiment, as a target for forming the semiconductor layer 133 by a sputtering method, an oxide target containing In, Ga, and Zn in an atomic ratio of In:Ga:Zn=3:1:2 is used to form an In—Ga—Zn-based oxide film (IGZO film) having a thickness of 25 nm.

Next, a conductive film is formed over the gate insulating layer 132 and the semiconductor layer 133 by a sputtering method, an evaporation method, or the like and then subjected to photolithography to form a source electrode layer 134a and a drain electrode layer 134b. With use of the source electrode layer 134a and the drain electrode layer 134b, the transistor is connected to another transistor or another element, which can lead to formation of a variety of circuits.

The source electrode layer 134a and the drain electrode layer 134b are formed using, for example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one or both of a lower side or an upper side of a metal film of Al, Cu, or the like. Further alternatively, a conductive metal oxide or the like can be used. As the conductive metal oxide, indium oxide ($In_2O_3$ or the like), tin oxide ($SnO_2$ or the like), zinc oxide (ZnO), indium tin oxide (ITO), indium oxide-zinc oxide (In$_2$O$_3$—ZnO or the like), or any of these metal oxide materials in which silicon oxide is contained can be used.

In this embodiment, a 50-nm-thick titanium film, a 400-nm-thick aluminum film, and a 100-nm-thick titanium film are stacked.

As illustrated in FIG. 3B, the insulating layer 103 is formed over the semiconductor layer 133, the source electrode layer 134a, and the drain electrode layer 134b by a plasma CVD, a sputtering method, or the like.

The insulating layer 103 can be formed using silicon oxide, silicon nitride, silicon oxynitride, silicon nitride oxide, aluminum oxide, aluminum oxynitride, hafnium oxide, gallium oxide, zinc gallium oxide, zinc oxide, or a mixed material thereof. Further, the insulating layer 103 may be either a single layer or a stacked layer.

In this embodiment, a 400-nm-thick silicon oxide film and a 200-nm-thick silicon oxynitride film are stacked.

Next, the first interlayer film 104 is formed over the insulating layer 103. As the first interlayer film 104, an insulating film with a planarization function is preferably selected in order to reduce surface unevenness due to the transistor. For example, an organic material such as a polyimide resin, an acrylic resin, or a benzocyclobutene resin can be used as a material of the first interlayer film 104. Other than such organic materials, it is also possible to use a low-dielectric constant material (a low-k material) or the like. Alternatively, the first interlayer film 104 may be formed by stacking a plurality of insulating films Rained using any of these materials.

In this embodiment, a polyimide single layer with a thickness of 1500 nm is formed.

Next, an opening 135 reaching the source electrode layer 134a is formed in the insulating layer 103 and the first interlayer film 104 by a photolithography step. As a method for forming the opening, a dry etching method, a wet etching method, or the like may be selected as appropriate.

Next, a conductive film is formed over the first interlayer film 104 by a sputtering method, an evaporation method, or the like and then subjected to photolithography to form wirings 136a to 136e.

For example, a metal film containing an element selected from Al, Cr, Cu, Ta, Ti, Mo, and W, or a metal nitride film containing any of the elements as a component (a titanium nitride film, a molybdenum nitride film, or a tungsten nitride film) can be used as a material of the wirings 136a to 136e. The wirings 136a to 136e may be either a single layer or a stacked layer.

In this embodiment, a 100-nm-thick titanium film, a 400-nm-thick aluminum film, and a 100-nm-thick titanium film are stacked.

Next, the second interlayer film 106 is formed over the wirings 136a to 136e. As the second interlayer film 106, an insulating film with a planarization function is preferably selected in order to reduce surface unevenness due to the wirings 136a to 136e. For example, an organic material such as a polyimide resin, an acrylic resin, or a benzocyclobutene resin can be used as a material of the second interlayer film 106. Other than such organic materials, it is also possible to use a low-dielectric constant material (a low-k material) or the like. Alternatively, the second interlayer film 106 may be formed by stacking a plurality of insulating films formed using any of these materials.

In this embodiment, a polyimide single layer with a thickness of 1500 nm is formed.

Next, an opening 137 reaching the wiring 136a is formed in the second interlayer film 106 by a photolithography step. As a method for forming the opening, a dry etching method, a wet etching method, or the like may be selected as appropriate.

Next, a conductive film is formed over the second interlayer film 106 by a sputtering method, an evaporation method, or the like and then subjected to photolithography to form the reflective electrode 108.

A material which efficiently reflects light generated from the light-emitting layer 112 is preferably used as a material of the reflective electrode 108. For example, a conductive film of a metal oxide, a titanium film, or the like can be formed thin on the side of the light-emitting layer 112, and a metal film (film of aluminum, an alloy containing aluminum, silver, or the like) which has high reflectance can be formed on the other side. Such a stacked structure is preferable because formation of an insulating film between the light-emitting layer 112 and the metal film with high reflectance (film of aluminum, an alloy containing aluminum, silver, or the like) can be suppressed.

In this embodiment, a 50-nm-thick titanium film, a 200-nm-thick aluminum film, and a 8-nm-thick titanium film are stacked.

Next, a transparent conductive layer is formed over the reflective electrode 108 by a sputtering method or the like and then subjected to photolithography to form the first microcavity layer 109. The first microcavity layer 109 is preferably formed over a pixel emitting red color. As a material of the first microcavity layer 109, a light-transmitting conductive material is preferably used. Note that in one embodiment of the present invention, instead of providing a microcavity layer that is a transparent conductive layer, optical adjustment may be performed by varying the thickness of the electrode or the light-emitting layer included in the light-emitting element between pixels.

In this embodiment, a 40-nm-thick single layer of ITO containing silicon is formed.

Next, a transparent conductive layer is formed over the reflective electrode 108 by a sputtering method or the like and then subjected to photolithography to form the second microcavity layer 111. The second microcavity layer 111 is preferably formed over a pixel emitting red light and a pixel emitting green. As a material of the second microcavity layer 111, a light-transmitting conductive material is preferably used.

In this embodiment, a 40-nm-thick single layer of ITO containing silicon is formed.

Next, as illustrated in FIG. 3C, the first partition 114 is formed over the reflective electrode 108, the first microcavity layer 109, and the second microcavity layer 111.

As a material of the first partition 114, an organic insulating material or an inorganic insulating material can be used. In particular, a photosensitive resin material is preferably used. Alternatively, a colored organic insulating material or the like can be used.

In this embodiment, the first partition 114 is formed to have a curved top surface.

Next, the second partition 115 is formed over the first partition 114.

As a material of the second partition, an inorganic insulating material or an organic insulating material can be used. As the organic insulating material, for example, a negative or positive type photosensitive resin material, a non-photosensitive resin material, or the like can be used. Further, a colored organic insulating material or the like can be used.

In this embodiment, the second partition 115 is formed to have a flat top surface and a reverse tapered shape in cross section.

Figure 4:
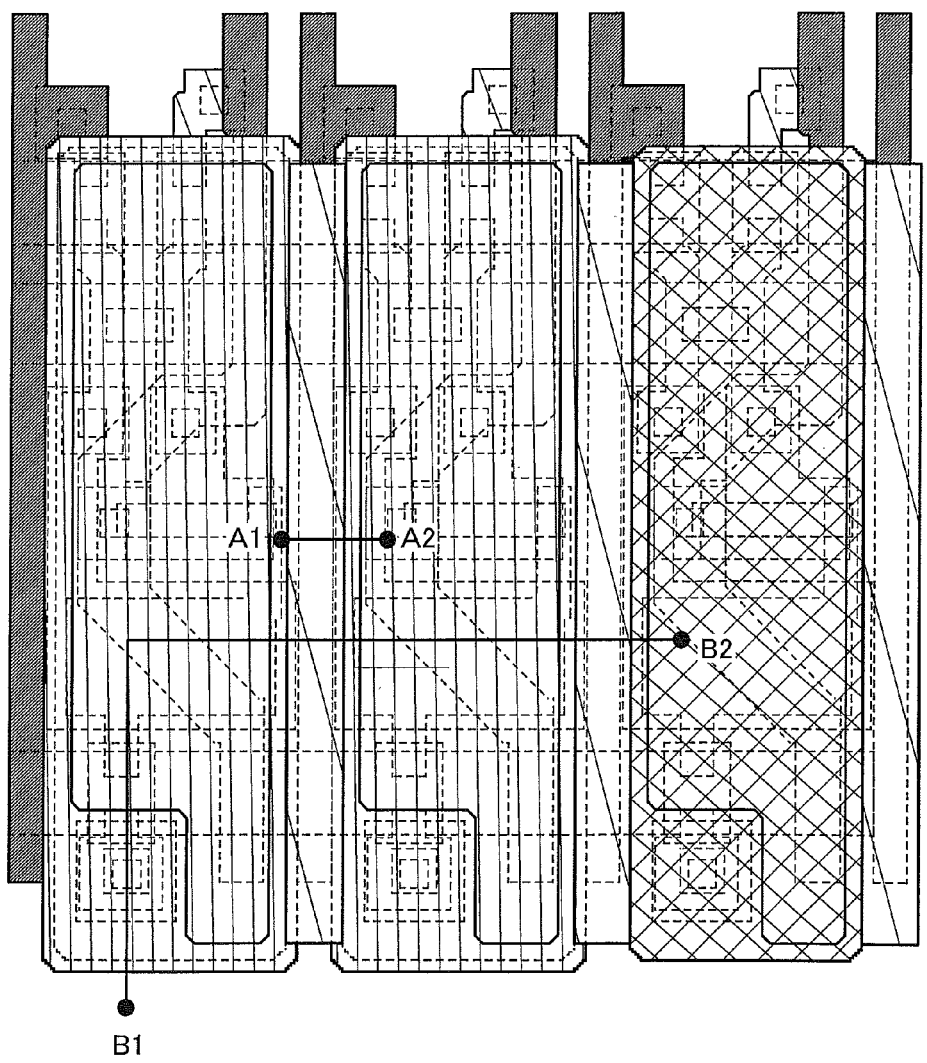
FIG. 4 is a plan view illustrating an organic EL display device.

FIG. 4 is a plan view of a state where steps up to and including formation of the second partition 115 are conducted. A cross-sectional view taken along solid line B1-B2 in FIG. 4 corresponds to FIG. 3C.

Next, the light-emitting layer 112 is formed over the reflective electrode 108, the first microcavity layer 109, the second microcavity layer 111, the first partition 114, and the second partition 115.

The light-emitting layer 112 can be formed by an evaporation method (including a vacuum evaporation method), or the like. The light-emitting layer 112 includes a plurality of light-emitting units and at least one intermediate unit. For example, the light-emitting layer 112 can include a B unit including a blue light-emitting layer, R and G units including a red light-emitting layer and a green light-emitting layer, an intermediate unit connecting these units, and the like. A color of light emitted from the light-emitting layer 112 is preferably white.

The light-emitting layer 112 is isolated by the first partition 114 and the second partition 115. The light-emitting layer 112 may be left on part of the top surface and the side surface of the second partition 115.

Next, the cathode 113 is formed over the light-emitting layer 112.

As a material of the cathode 113, a light-transmitting metal oxide or the like can be used. As the light-transmitting metal oxide, indium oxide ($In_2O_3$ or the like), tin oxide ($SnO_2$ or the like), zinc oxide (ZnO), indium oxide-tin oxide ($In_2O_3$—$SnO_2$ or the like, which is abbreviated to ITO), indium oxide-zinc oxide ($In_2O_3$—ZnO or the like), any of these metal oxide materials in which silicon oxide is contained, or the like can be used. In this specification, the case where the reflective electrode 108 is an anode is described; however, the reflective electrode 108 may be a cathode and a conductive layer functioning as an anode may be used instead of the cathode 113.

The light-emitting element 107 is formed with the reflective electrode 108, the first microcavity layer 109, the second microcavity layer 111, the light-emitting layer 112, and the cathode 113.

Through the above steps, the transistor 102 and the light-emitting element 107 are formed over the first substrate 110.

Next, a method for forming the base layer 162, the black matrix 163, the red color filter 164, the green color filter 165, and the blue color filter 166 on the second substrate 160 is described with reference to FIGS. 5A to 5C.

Figure 5A:
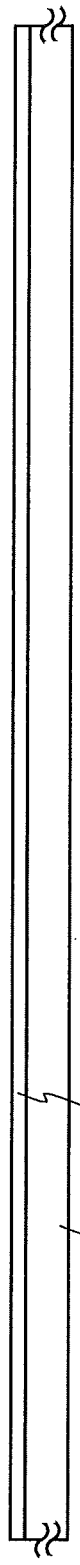
FIGS. 5A to 5C are cross-sectional views illustrating a method for manufacturing an organic EL display device.

As illustrated in FIG. 5A, the base layer 162 is formed over the second substrate 160.

The base layer 162 is formed using a material and a method similar to those of the base layer 101.

In this embodiment, the base layer 162 has a stacked structure of a 100-nm-thick silicon nitride film and a 150-nm-thick silicon oxynitride film.

Figure 5B:
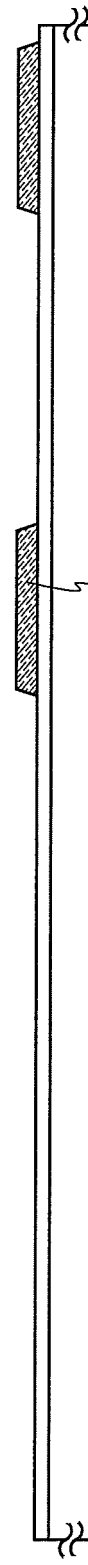

Next, as illustrated in FIG. 5B, a light-blocking film is formed over the base layer 162 and subjected to photolithography to form the black matrixes 163. The black matrixes 163 are disposed between the red color filter 164 and the green color filter 165, between the green color filter 165 and the blue color filter 166, and between the blue color filter 166 and the red color filter 164.

As a material of the black matrix 163, a metal layer having low reflectance, such as titanium or chromium, an organic resin film which is impregnated with black pigment or black dye, or the like can be used.

In this embodiment, the black matrix 163 is formed with a single layer of a 500-nm-thick organic resin layer which is impregnated with black pigment or black dye.

Figure 5C:
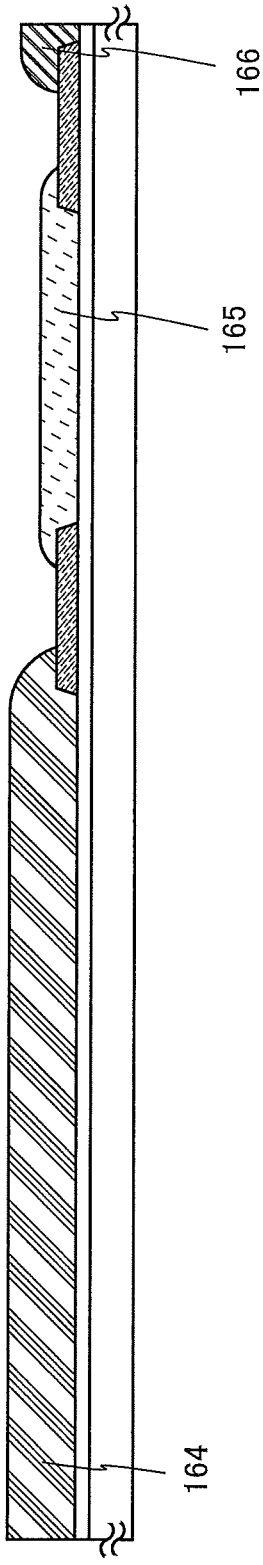

Next, as illustrated in FIG. 5C, the red color filter 164, the green color filter 165, and the blue color filter 166 are formed between the black matrixes 163 which are provided over the base layer 162. The color filters are colored layers of RGB. Note that end portions of the black matrixes may be covered with the color filters.

The red color filter 164, the green color filter 165, and the blue color filter 166 can be formed using a known material by a printing method, an inkjet method, an etching method using a photolithography step, or the like.

The color filter transmits light with a specific wavelength. When light generated from the light-emitting layer passes through the color filters, color separation of three colors of RGB occurs. For example, the red color filter 164 selectively transmits light with a red wavelength band. The green color filter 165 selectively transmits light with a green wavelength band. The blue color filter 166 selectively transmits light with a blue wavelength band.

The color filters are not particularly limited to three colors of RGB. Color filters of four colors may be employed by adding a yellow color filter or the like to RGB, or color filters of five or more colors may be employed.

In this embodiment, the red color filter 164 is formed with a single layer of a 2000-nm-thick organic resin layer. The green color filter 165 is formed with a single layer of a 1600-nm-thick organic resin layer. The blue color filter 166 is formed with a single layer of a 1200-nm-thick organic resin layer.

Through the above steps, the second substrate 160 provided with the base layer 162, the black matrix 163, the red color filter 164, the green color filter 165, and the blue color filter 166 is formed.

The first substrate 110 and the second substrate 160 which are formed by the above methods are disposed so that the partition overlaps with the black matrix 163, whereby the organic EL display device 100 illustrated in FIG. 1 can be manufactured.

Figure 6A:
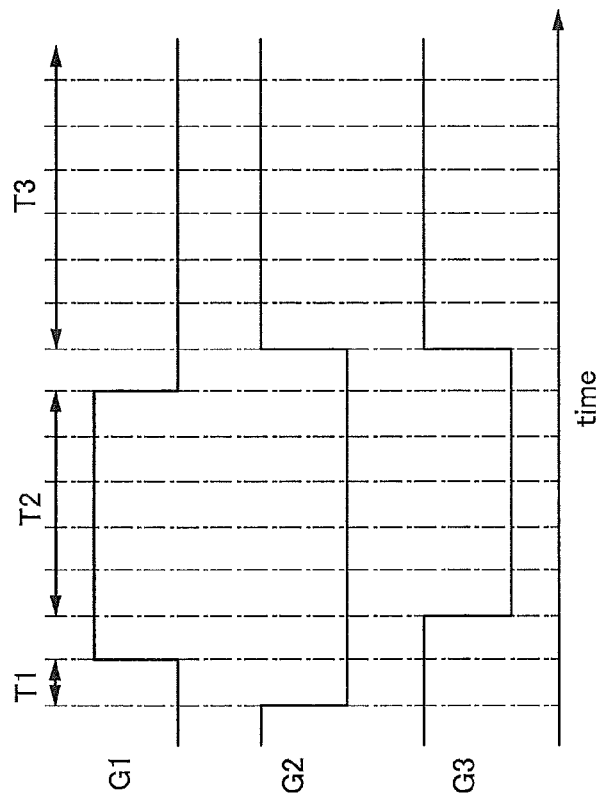
FIGS. 6A and 6B show an example of a pixel circuit and an example of a timing chart.
Figure 6B:
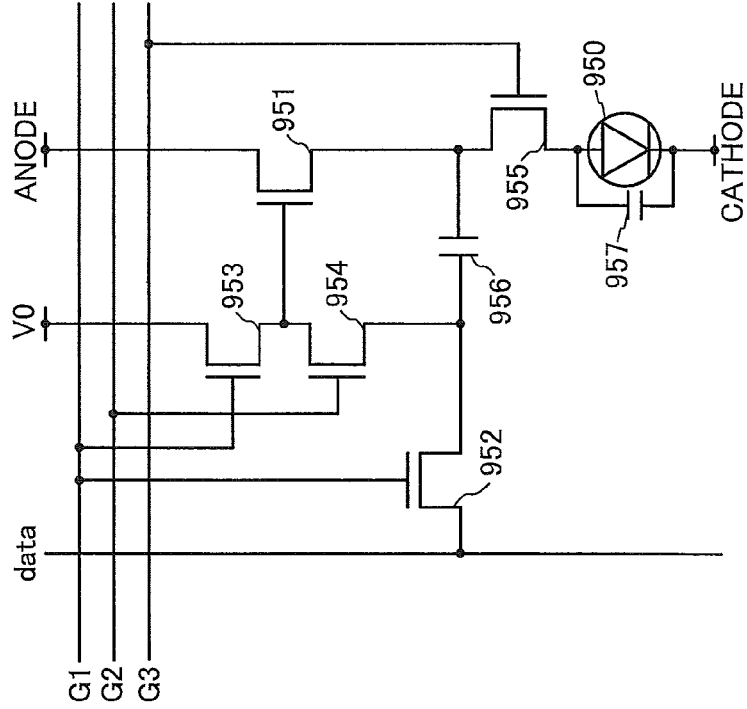

Next, a pixel circuit including the organic EL display device 100 is described with reference to FIGS. 6A and 6B. FIG. 6A illustrates an example of a circuit diagram of a pixel. FIG. 6B is an example of a timing chart of the pixel circuit shown in FIG. 6A.

The pixel circuit shown in FIG. 6A includes a light-emitting element 950, transistors 951 to 955, and a capacitor 956. Note that a capacitor 957 is shown as a capacitance of the light-emitting element 950.

The light-emitting element 950 has a function of emitting light in accordance with the amount of current which flows between an anode and a cathode. A cathode potential (also referred to as CATHODE in this diagram) is supplied to the cathode of the light-emitting element 950.

An anode potential (also referred to as ANODE in this diagram) is supplied to a drain of the transistor 951. The transistor 951 functions as a driving transistor.

A data signal data is input into a source of the transistor 952, and a gate signal G1 is input into a gate of the transistor 952.

In the transistor 953, one of a source and a drain is supplied with a potential V0, and the other of the source and the drain is electrically connected to a gate of the transistor 951. Further, the gate signal G1 is input into a gate of the transistor 953.

One of a source and a drain of the transistor 954 is electrically connected to the gate of the transistor 951, and a gate signal G2 is input into a gate of the transistor 954.

In the transistor 955, one of a source and a drain is electrically connected to a source of the transistor 951, and the other of the source and the drain is electrically connected to the anode of the light-emitting element 950. Further, a gate signal G3 is input into a gate of the transistor 955.

In the capacitor 956, one of a pair of electrodes is electrically connected to the other of the source and the drain of the transistor 952 and the other of the source and the drain of the transistor 954, and the other of the pair of electrodes is electrically connected to the source of the transistor 951.

Next, the example of a method for driving the pixel circuit shown in FIG. 6A is described with reference to a timing chart in FIG. 6B.

A period T1 in FIG. 6B is an initialization period. In the period T1, the transistor 955 is turned on and the transistors 952, 953, and 954 are turned off.

At this time, the level of the source potential of the transistor 951 is lower than the level of the potential V0.

A period T2 is a threshold detection period. In the period T2, the transistors 952 and 953 are turned on and the transistors 954 and 955 are turned off.

At this time, when the gate potential of the transistor 951 is equivalent to the potential V0 and the level of a voltage between the gate and the source of the transistor 951 (the voltage is also referred to as Vgs 951) is equivalent to the level of a threshold voltage of the transistor 951 (the threshold voltage is also referred to as Vth 951), the transistor 951 is turned off. Here, the source potential of the transistor 951 can be obtained from the formula V0-Vth 951. Moreover, the level of the potential of the one of the pair of electrodes of the capacitor 956 is equivalent to the level of the potential Vdata of the data signal data.

A period T3 is a light-emitting period. In the period T3, the transistors 954 and 955 are turned on and the transistors 952 and 953 are turned off.

At this time, the level of the gate potential of the transistor 951 is equivalent to the level of the potential Vdata of the data signal data, and Vgs 951 can be obtained from the formula Vdata-Vth 951+V0. Accordingly, current that flows between the source and the drain of the transistor 951 in a saturation region (the current is also referred to as Ids 951) does not depend on Vth 951 but depends on Vdata; thus, the influence of the fluctuation of Vth 951 can be suppressed.

Further, the light-emitting element 950 emits light in accordance with Ids 951.

In the above manner, the pixel circuit shown in FIG. 6A can operate.

The organic EL display device 100 described in this embodiment includes a partition having characteristics in the shape and the height. Specifically, the partition has a stacked structure formed using different materials. A lower partition has a curved top surface. An upper partition has a flat top surface and a reverse tapered shape in cross section. The height is less than or equal to 1.3 μm. With the partition having such characteristics, a variety of problems such as a reduction in viewing angle dependency, an improvement in contrast, suppression of leakage current from an intermediate layer to an adjacent pixel, or suppression of light leakage to the adjacent pixel can be efficiently solved. Thus, high-definition display of the organic EL display device 100 can be achieved.

This embodiment can be freely combined with the other embodiment in this specification.

(Embodiment 2)

In this embodiment, an organic EL display device 200 which enables high-definition display will be described. In the organic EL display device 200, a shape of a partition is adjusted, and the height of the partition is controlled to be higher than or equal to 0.5 μm and less than or equal to 1.3 μm.

Note that except that a wiring layer is not formed between a light-emitting layer and a transistor, the organic EL display device 200 described in this embodiment can have a structure similar to that of the organic EL display device 100 described in Embodiment 1. Thus, Embodiment 1 can be referred to for the detailed description.

Figure 8:
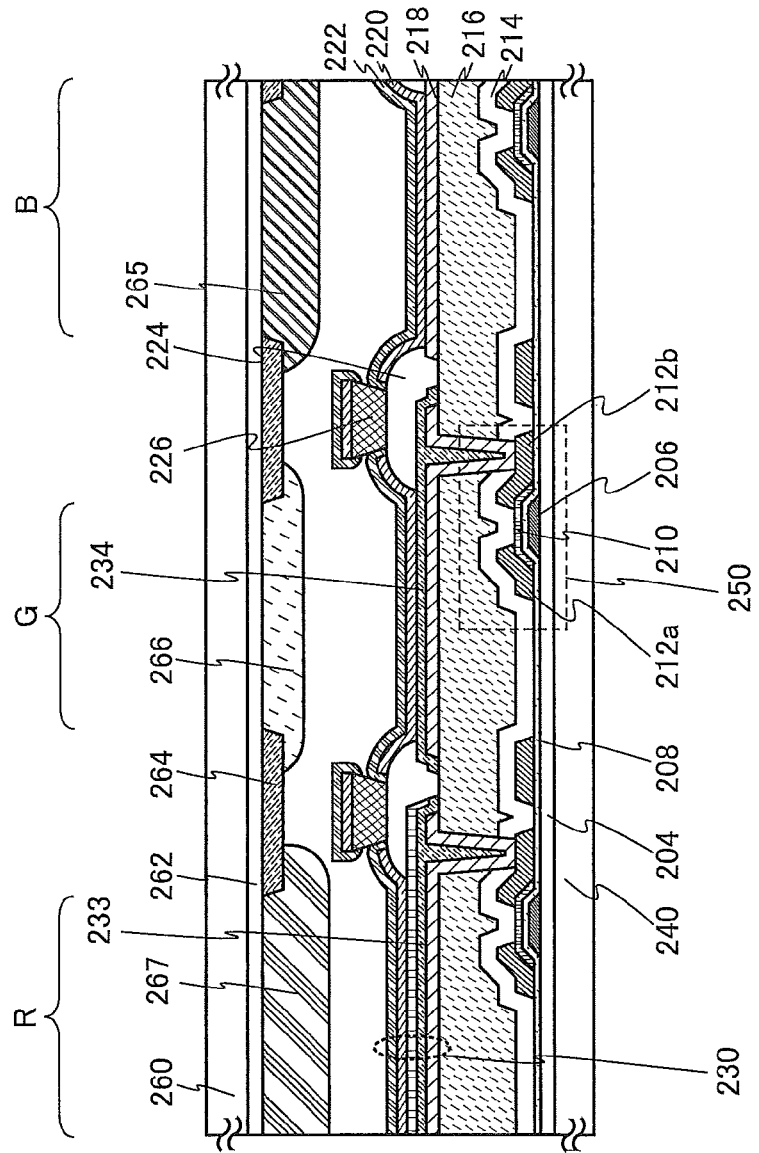
FIG. 8 is a cross-sectional view illustrating an organic EL display device.

As illustrated in FIG. 8, the organic EL display device 200 includes a first substrate 240, a base layer 204 over the first substrate 240, a transistor 250 over the base layer 204, an insulating layer 214, a first interlayer film 216 over the insulating layer 214, a light-emitting element 230 electrically connected to the transistor 250, and a first partition 224 and a second partition 226 which isolate the light-emitting element 230. In addition, a second substrate 260 is included to be opposite to the first substrate 240. The second substrate 260 is provided with a base layer 262, a black matrix 264, a red color filter 267, a green color filter 266, and a blue color filter 265. The transistor 250 includes a gate electrode 206, a semiconductor layer 210, a source electrode 212a, a drain electrode 212b, and a gate insulating layer 208. The light-emitting element 230 includes a reflective electrode 218, a first microcavity layer 233, a second microcavity layer 234, a light-emitting layer 220, and a cathode 222.

The first partition 224 preferably has a curved top surface. The second partition 226 preferably has a flat top surface and a reverse tapered shape in cross section.

The vertical distance between the top surface of the reflective electrode 218 and the top surface of the second partition 226 is greater than or equal to 0.5 μm and less than or equal to 1.3 μm.

Thus, even in the case where a panel has a large size, the organic EL display device 200 including the first partition 224 and the second partition 226 can achieve high-definition display and an improvement in image quality.

This embodiment can be freely combined with the other embodiment in this specification.

This application is based on Japanese Patent Application serial no. 2012-171410 filed with Japan Patent Office on Aug. 1, 2012, the entire contents of which are hereby incorporated by reference.

What is claimed is:

1. A display device comprising:
   a first electrode;
   a first partition overlapping with an end portion of the first electrode;
   a second partition over and in contact with the first partition;
   a light-emitting layer over the first electrode and a part of the first partition; and
   a second electrode over the light-emitting layer,
   wherein a perpendicular distance between a top surface of the first electrode and a top surface of the second partition is greater than or equal to 0.5 μm and less than or equal to 1.3 μm,
   wherein the first partition includes a photosensitive resin material, and
   wherein the second partition includes a photosensitive resin material.

2. The display device according to claim 1, further comprising:
   a first substrate having a first surface;
   a second substrate having a second surface facing the first surface;
   a color filter layer over the second surface; and
   a black matrix over the second surface,
   wherein the first electrode is located over the first surface of the first substrate, and wherein the first partition overlaps with the black matrix.

3. The display device according to claim 2, wherein a perpendicular distance between a surface of the color filter layer on the first substrate side and the top surface of the first electrode is less than or equal to 3 µm.

4. The display device according to claim 1, wherein the first partition has a curved top surface.

5. The display device according to claim 1, further comprising a transparent conductive layer over and in contact with the first electrode.

6. The display device according to claim 5, wherein the transparent conductive layer has a stacked structure.

7. The display device according to claim 1, wherein a length in a direction of a long side of the top surface of the second partition is larger than or equal to a length in a direction of a long side of the first electrode.

8. The display device according to claim 1, wherein the second partition has a reverse tapered shape.

9. The display device according to claim 1, further comprising a transistor electrically connected to the first electrode, wherein the transistor includes an oxide semiconductor in a channel formation region.

10. The display device according to claim 1, wherein the second partition is located only between pixels of different colors.

11. The display device according to claim 1, further comprising a third partition between pixels of the same color,
wherein the second partition is located between pixels of different colors, and
wherein a material of the third partition is same as a material of the second partition.

12. A display device comprising:
a first pixel and a second pixel adjacent to the first pixel, each of the first pixel and the second pixel comprising:
a first electrode; and
a light-emitting layer over the first electrode;
a first partition overlapping with an end portion of the first electrode of the first pixel and an end portion of the first electrode of the second pixel; and
a second partition being over and in contact with the first partition, and between the first electrode of the first pixel and the first electrode of the second pixel,
wherein a perpendicular distance between a top surface of the first electrode and a top surface of the second partition is greater than or equal to 0.5 µm and less than or equal to 1.3 µm,
wherein the first partition includes a photosensitive resin material, and
wherein the second partition includes a photosensitive resin material.

13. The display device according to claim 12, further comprising:
a first substrate having a first surface:
a second substrate having a second surface facing the first surface;
a color filter layer over the second surface; and
a black matrix over the second surface,
wherein the first electrode of the first pixel and the first electrode of the second pixel are located over the first surface, and
wherein the first partition overlaps with the black matrix.

14. The display device according to claim 13, wherein a perpendicular distance between a surface of the color filter layer on the first substrate side and the top surface of the first electrode is less than or equal to 3 µm.

15. The display device according to claim 12, wherein the first partition has a curved top surface.

16. The display device according to claim 12, further comprising a transparent conductive layer over and in contact with the first electrode.

17. The display device according to claim 16, wherein the transparent conductive layer has a stacked structure.

18. The display device according to claim 12, wherein a length in a direction of a short side of the top surface of the second partition is smaller than or equal to a distance between the first electrode of the first pixel and the first electrode of the second pixel.

19. The display device according to claim 12, wherein a length in a direction of a long side of the top surface of the second partition is larger than or equal to a length in a direction of a long side of the first electrode.

20. The display device according to claim 12, wherein the second partition has a reverse tapered shape.

21. The display device according to claim 12, further comprising a transistor electrically connected to the first electrode, wherein the transistor includes an oxide semiconductor in a channel formation region.

22. The display device according to claim 12, wherein a color of the first pixel is different from a color of the second pixel.

23. The display device according to claim 12, further comprising:
a third pixel adjacent to the first pixel, the third pixel including the first electrode and the light-emitting layer; and
a third partition between the first pixel and the third pixel,
wherein a material of the third partition is same as a material of the second partition,
wherein the second partition is located between the first pixel and the second pixel,
wherein a color of the first pixel is different from a color of the second pixel, and
wherein a color of the third pixel is same as the color of the first pixel.

24. A display device comprising:
a first electrode and a second electrode over an insulating surface;
a first transparent conductive layer over the first electrode;
a second transparent conductive layer over the first transparent conductive layer;
a third transparent conductive layer over the second electrode;
a first partition over the insulating surface, an end portion of the second transparent conductive layer, and an end portion of the third transparent conductive layer, the first partition overlapping with an end portion of the first electrode and an end portion of the second electrode;
a second partition over and in contact with the first partition;
a first light-emitting layer over the second transparent conductive layer and a part of the first partition;
a second light-emitting layer over the third transparent conductive layer and a part of the first partition;
a third electrode over the first light-emitting layer; and
a fourth electrode over the second light-emitting layer;
wherein a perpendicular distance between a top surface of the first electrode and a top surface of the second partition is greater than or equal to 0.5 µm and less than or equal to 1.3 µm, and
wherein the first partition includes a photosensitive resin material.

25. The display device according to claim 24, further comprising:
a first substrate having a first surface;

a second substrate having a second surface facing the first surface;
a color filter layer over the second surface; and
a black matrix over the second surface,
wherein the first electrode is located over the first surface of the first substrate, and
wherein the first partition overlaps with the black matrix.

26. The display device according to claim 25, wherein a perpendicular distance between a surface of the color filter layer on the first substrate side and the top surface of the first electrode is less than or equal to 3 μm.

27. The display device according to claim 24, wherein the first partition has a curved top surface.

28. The display device according to claim 24, wherein the second partition has a reverse tapered shape.

29. The display device according to claim 24, further comprising a transistor electrically connected to the first electrode, wherein the transistor includes an oxide semiconductor in a channel formation region.

30. The display device according to claim 24, wherein the first light-emitting layer is included in a pixel emitting red light and the second light-emitting layer is included in a pixel emitting green light.

* * * * *